United States Patent [19]

Chang et al.

[11] Patent Number: 5,198,381
[45] Date of Patent: Mar. 30, 1993

[54] METHOD OF MAKING AN E²PROM CELL WITH IMPROVED TUNNELING PROPERTIES HAVING TWO IMPLANT STAGES

[75] Inventors: Kuang-Yeh Chang, Los Gatos; Subhash R. Nariani, San Jose, both of Calif.

[73] Assignee: VLSI Technology, Inc., San Jose, Calif.

[21] Appl. No.: 758,554

[22] Filed: Sep. 12, 1991

[51] Int. Cl.⁵ .................................... H01L 21/266
[52] U.S. Cl. .................................... 437/43; 437/30; 437/149; 437/979
[58] Field of Search .................... 437/27, 28, 29, 30, 437/38, 43, 44, 147, 148, 149, 153, 953, 978, 979; 148/DIG. 163

[56] References Cited

U.S. PATENT DOCUMENTS

| | | | |
|---|---|---|---|
| 4,520,553 | 6/1985 | Kraft | 437/979 |
| 4,642,881 | 2/1987 | Matsukawa et al. | 437/30 |
| 4,851,361 | 6/1989 | Schumann et al. | 437/43 |
| 5,100,819 | 3/1992 | Gill et al. | 437/43 |

Primary Examiner—Brian E. Hearn
Assistant Examiner—C. Chaudhari
Attorney, Agent, or Firm—Burns, Doane, Swecker & Mathis

[57] ABSTRACT

The present invention is directed to a semiconductor memory device and a method for fabricating a semiconductor memory device, in particular a E²PROM, having an improved tunnel area wherein electrons travel to and from a floating gate. The tunnel area is characterized by properties which lend to a relatively large number of programming and erasure cycles over the life of the E²PROM. The tunnel area includes a tunneling gate which is fabricated via two implant stages. Because these two stages are separate from one another, each of the implant stages can be independently optimized to improve the properties of the tunnel area. Further, the windows used to define the implant regions are easily fabricated and are designed to facilitate formation of the implant regions. The method of defining the window lends to easy scaling of the process for advancing generations of technology.

14 Claims, 3 Drawing Sheets

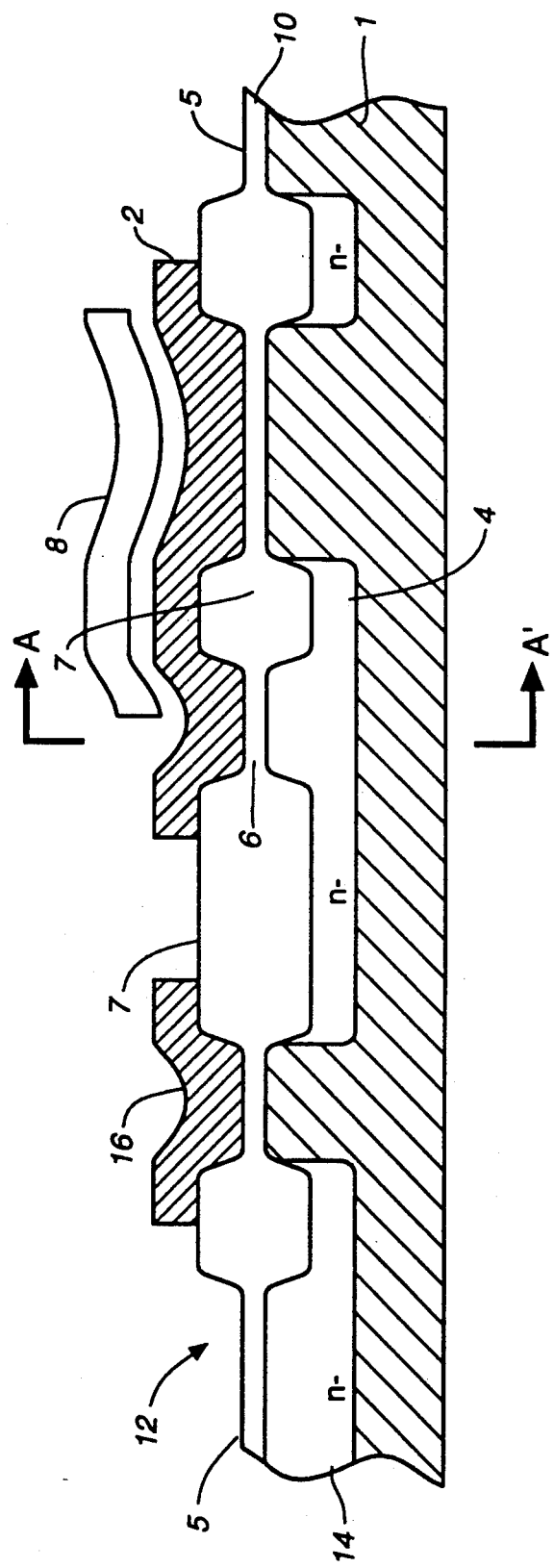
FIG._1

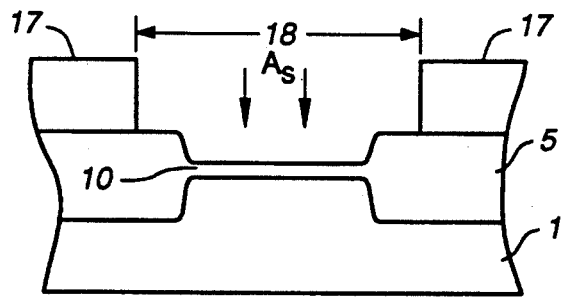
FIG._2A
(PRIOR ART)
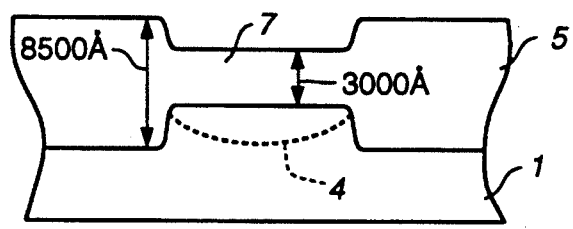
FIG._2B
(PRIOR ART)
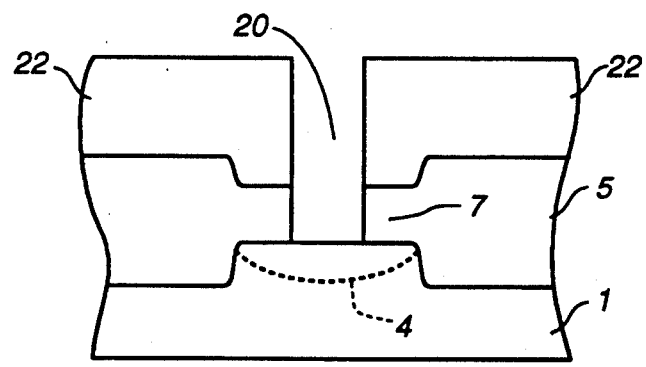
FIG._2C
(PRIOR ART)
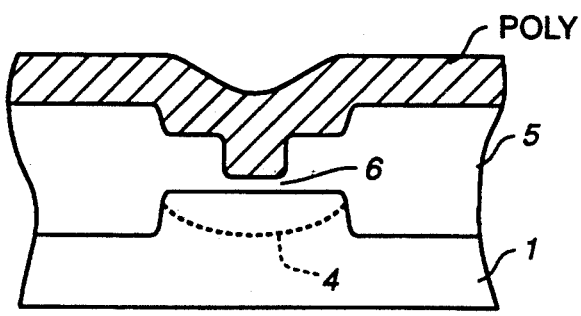
FIG._2D
(PRIOR ART)

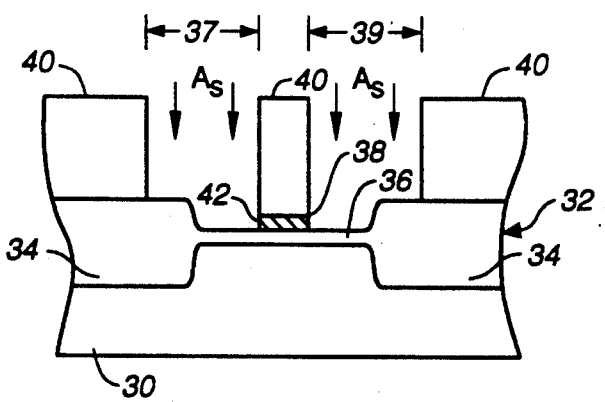
FIG._3A
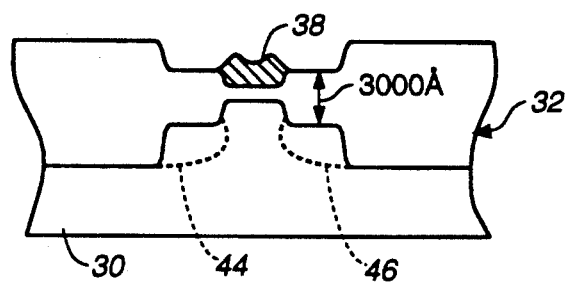
FIG._3B
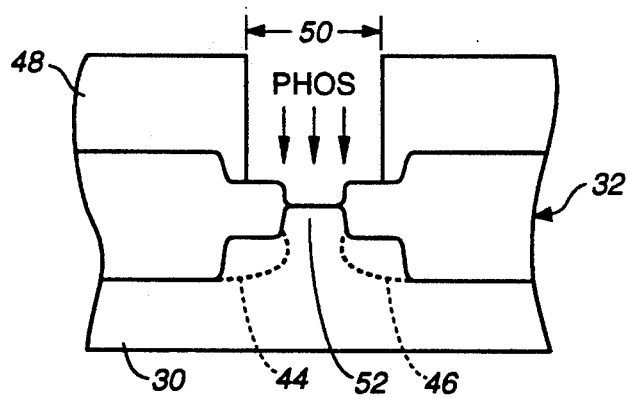
FIG._3C
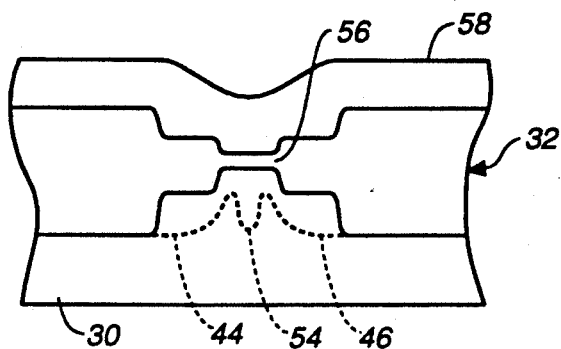
FIG._3D

METHOD OF MAKING AN E²PROM CELL WITH IMPROVED TUNNELING PROPERTIES HAVING TWO IMPLANT STAGES

FIELD OF THE INVENTION

1. Field of the Invention

The present invention relates generally to nonvolatile memories, and in particular to electrically erasable programmable read only memories (i.e., EEPROMs or E²PROMs).

2. State of the Art

Read only memories (ROMs) are non-volatile memory devices whose contents are typically programmed during fabrication. Once programmed, a standard ROM cannot be erased and reprogrammed. ROMs find utility in storing information such as operating code, reference data and so forth. Nonvolatile ROMs, have the advantage that stored information is not erased when power is removed from the device.

More recently, electrically programmable ROMs (EPROMs) have been developed. EPROMs are memory devices in which data can be written electronically using a technique known as hot electron injection. With hot electron injection, a floating gate is charged by energizing carrier electrons to high energy levels. The high energy electrons are then able to pass through an insulator and into the floating gate.

However, EPROMs typically use ultraviolet (UV) light to erase stored data. Accordingly, erasing an EPROM's contents requires removal of the EPROM from a circuit board. Such a procedure is inconvenient and time consuming.

Electrically erasable PROMs (EEPROM or E²PROM) are another variety of known memory devices. A document entitled "Comparison And Trends In Today's Dominant E² Technologies", by S.K. Lai, V.K. Dham and D. Guterman generally describes two approaches for charging a floating gate of an E²PROM via a thin tunnel oxide.

E²PROMs do not require a UV light source for erasure and do not necessarily require the memory device to be removed from the circuit board for reprogramming. Typically, E²PROM cells are fabricated using metal oxide semi-conductor field effect transistors (MOSFETs) as described in U.S. Pat. No. 4,477,883. As shown in FIG. 1 of the present application, an E²PROM memory cell is formed with a double layer of polysilicon and three electrodes electrically isolated from each other. E²PROMs use this configuration to exploit the known phenomenon of electron tunneling during programming and erasure.

Referring to FIG. 1, a first electrode 2 is formed from a first polysilicon layer as a floating gate completely encapsulated in an oxide insulating layer. Typically, the thickness in an area of the oxide under the gate is reduced to form a tunnel window region formed as a thin tunnel oxide layer. This tunnel window region is either defined in the thin gate oxide layer 10 (e.g., 300–400 Å) or a special thicker, decoupling oxide layer (e.g., 3000 Å) of a field shown as field oxide layer 5 in FIG. 1 (e.g., 8500 Å).

During normal operating voltages (e.g., 5 V), the tunnel oxide effectively isolates the floating gate to prevent charge migration to or from the floating gate. However, when subjected to relatively high voltages (e.g., 20 V), electrons tunnel through the thin oxide insulating layer in the aforementioned tunnel window region. Thus, a high voltage state can be used to program or erase the floating gate. When the floating polysilicon is charged positive, the memory cell will be turned on and conduct a current during a read operation. When the floating polysilicon is charged negative, the memory cell is turned off and will not conduct current during a read operation.

As shown in FIG. 1, a second electrode 4 is formed from an n- implant in a substrate 1 as a tunneling gate. Electrons tunnel between the electrodes 2 and 4 via the thin tunnel oxide layer 6 (e.g., 100 Å) formed within a tunnel window region of the decoupling oxide layer 7 interposed between the electrodes 2 and 4. A third electrode 8 is formed from a second polysilicon layer as a coupling gate.

The tunneling gate 4 is capacitively coupled to the floating gate 2 as is the coupling gate 8. The combination of the coupling gate 8, the floating gate 2 and the tunneling gate 4 can thus be represented schematically by two capacitors connected in series. The tunneling gate 4 and the coupling gate 8 control the charge and discharge (programming and erasure) of majority carriers (i.e., electrons) in the floating gate 2.

As shown in FIG. 1, a select transistor 12 is formed on substrate 1. The select transistor is formed with a portion of the tunneling gate 4, an n- implant representing a gate select contact 14, a portion of the thin gate oxide layer 10 and portion 16 of the first polysilicon layer.

When data is written into the FIG. 1 memory cell, a low voltage (e.g., ground) is supplied via the select transistors (e.g., via gate select contact 14) to the tunneling gate 4. In addition, the coupling gate 8 is placed at a high potential (e.g., 20 volts). Accordingly, electrons pass from the gate select contact 14 across the substrate 1 to the tunneling gate 4. From the tunneling gate 4, these electrons pass through the thin tunnel oxide layer 6 and into the floating gate 2 where a negative charge is stored. The tunneling current flows through the thin tunnel oxide layer 6 in a region where the tunneling gate 4 and the floating gate 2 overlap. Electrons are thereby injected into the floating gate 2 to write the logic low, or "∅". In this state, there is no current flow through this cell during a read operation.

To write a logic level 1, the coupling gate 8 associated with the floating gate 2 is grounded while the gate select contact 14 and the tunneling gate 4 are raised to a high potential (e.g., 20 volts). As a result, the floating gate 2 returns to a logic level high, or "1" by emitting tunneling electrons to the voltage source via the thin oxide layer 6. The floating gate is thereby left positively charged and the cell conducts a current during a read operation. In alternate embodiments, polysilicon-to-polysilicon tunneling can be used to remove floating gate electrons from the floating gate during an erasure mode.

FIGS. 2a–2d show a method for fabricating a memory cell of an E²PROM such as that shown in FIG. 1. FIG. 2a shows formation of the FIG. 1 E²PROM cell from a point following coating of a photoresist layer 17 on the field oxide layer 5 and substrate 1. A window in the photoresist layer 17, generally represented as window 18 encompasses a portion of the field oxide layer 5 and the thin gate oxide layer 10 so that an arsenic (As) implant can be used to form the tunneling gate 4 of FIG. 1. A thicker decoupling oxide 7 is then grown over the arsenic implanted area.

FIG. 2b shows the arsenic implanted as the tunneling gate 4. As shown in FIG. 2b, the field oxide layer 5 is approximately 8500 Angstroms (Å) and the decoupling oxide layer 7 is shown to be approximately 3000 Å.

In FIG. 2c, a tunneling window 20 is formed in the decoupling oxide layer 7 following coating of a photoresist layer 22 and an etching process. The etching process is used to remove a portion of the decoupling oxide layer 7 located within the tunnel window 20. This portion of the decoupling oxide layer is removed down to the substrate 1.

In FIG. 2d, the photoresist layer 22 has been stripped and a tunnel window oxide layer 6, approximately 100 Å thick, is grown. Afterwards, the first polysilicon layer 2 is deposited and formation of the remaining portion of the FIG. 1 $E^2PROM$ continued in known fashion.

The foregoing fabrication process of the FIG. 1 $E^2$-PROM has several, significant drawbacks. For example, the FIG. 2c etching process has significant disadvantages. Generally speaking, there are two types of etching: dry etching using plasma to etch a surface, and wet etching where a liquid chemical is used to dissolve material on a wafer surface.

The use of a dry etch to perform the etching process of FIG. 2c can significantly damage the silicon surface during removal of the decoupling oxide down to the substrate 1. This degrades the quality of the tunnel oxide layer grown in the tunnel area. On the other hand, a wet etch process is difficult to control through the thick decoupling oxide layer 7. For example, the etching chemical may not wet the entire area within the tunnel window 20 such that an incomplete etching process may occur and significantly degrade the quality of the tunnel window oxide layer. Additionally, the wet chemical may not wet all the tunnel windows on an IC chip (which can number many thousand) leaving some windows unetched or partially etched and resulting in bad memory cells and low net yield.

Alternately, the chemical used for the wet etch may over-etch the area within the tunnel window 20, similarly degrading performance of the tunnel window oxide layer by increasing its size and the potential for current leakage during operation. This increase in tunnel window size also affects the electrical capacitance of the tunnel oxide which adversely affects the electrical performance. Finally, the wetting efficiency of a liquid is dependent on the size of the hole being wetted; it becomes more difficult as the hole size is reduced. This makes wet etching of the tunnel window less dependable as transistor sizes decrease and IC density increases.

Because the FIG. 2a-2d process uses a single n-implant for the tunneling gate 4, design flexibility of the tunneling gate is also limited. Certain performance characteristics must be compromised to optimize other properties of the tunneling gate. For example, it is known that if the substrate 4 is very heavily doped or implanted, the quality of the oxide grown (i.e., tunnel oxide 6) is compromised, resulting in higher leakage through the tunnel oxide layer 6. Because a single implant is used to create the tunneling gate 4, the dose of the entire region must be sufficiently low to prevent leakage current across the tunnel oxide layer 6 during normal operation. However, this low dosage results in a high resistance tunneling gate which hinders electron movement in and out of the tunneling gate via the gate select contact 14, thus decreasing operating efficiency during programming and erasure.

Accordingly, it would be desirable to provide a semiconductor memory device and method for fabricating a semiconductor memory device which overcomes the aforementioned deficiencies.

SUMMARY OF THE INVENTION

The present invention is directed to a semiconductor memory device and a method for fabricating a semiconductor memory device, in particular an $E^2PROM$, having an improved tunnel area wherein electrons travel to and from a floating gate of the $E^2PROM$ cell. An $E^2$-PROM cell designed in accordance with the invention includes a tunneling gate fabricated via two implant stages. Because these two stages are separate from one another, each of the implant stages is independently optimized to improve the properties of the tunnel area. These properties enhance operating efficiency of the memory device, and extend the operating life of the memory device. Further, the windows used to define the implant regions are easily fabricated and provide for easy control of etching.

More particularly, the two separate implant regions permit two separate doses of different materials to be implanted in the tunnel gate. For example, in a first outer implant region of the tunnel gate, the dose can be increased to reduce resistance. On the other hand, a second region of the tunnel gate under the thin tunnel oxide layer can be formed with a decreased dose to reduce leakage of the tunnel oxide during normal operation of the memory cell.

In establishing windows to define the implant regions, the same mask used to fabricate an active area of peripheral transistors (e.g., select transistors) can be used to define a first implant region. Further, a relatively large window can be used to establish a second implant region. This relatively large window can be defined with a wide tolerance without concern that over-etching will damage the substrate.

In accordance with a preferred embodiment, a method for fabricating a cell for use in a semiconductor memory device such an $E^2PROM$ includes the steps of forming a first oxide layer of varying thickness on a semiconductor substrate, the oxide layer having a first portion formed of a first thickness and a second portion formed of a second thickness greater than said first thickness. When the second thicker oxide is being grown, a silicon nitride layer on the first oxide prevents further growth of the first oxide. A first implant region of the substrate is defined beneath the first portion of the oxide layer by coating a photoresist material as a mask on the silicon nitride layer and exposing the tunnel gate area around (but not under) the tunnel window area. The silicon nitride is etched on this tunnel gate area and a first dose of a conductive material is implanted within the first implant region. The photoresist mask is then removed. A third oxide layer is grown on the first oxide layer with the nitride layer in place over the tunnel area of the first oxide layer. Thus, only a thin oxide in the area of the tunnel oxide needs to be etched away. This oxide is surrounded by a significantly thicker decoupling oxide which therefore defines the edge of the tunnel window.

A second implant region of the substrate is defined beneath the tunnel area of the oxide layer by removing the silicon nitride layer and coating a second photoresist mask on the third oxide layer. A second dose of a conductive material is implanted within the second implant region. The first layer of oxide is removed from the tunnel area as is the second photoresist mask. A tunnel window oxide layer is grown on the substrate. At least a first polysilicon layer is then deposited over the tunnel window oxide layer to form a conductive region of the semiconductor memory cell.

BRIEF DESCRIPTION OF THE DRAWINGS

Other objects and advantages of the present invention will become apparent from the following detailed description when read in conjunction with the accompanying drawings wherein like elements have been designated by like numerals and wherein:

FIG. 1 shows an E$^2$PROM memory cell and gate select transistor;

FIGS. 2a-2d show a conventional fabrication method for forming a conventional E$^2$PROM memory cell as shown in the right hand side of FIG. 1; and FIGS. 3a-3d show an exemplary embodiment of a fabrication method for forming an E$^2$PROM memory cell as shown in the right hand side of FIG. 1 in accordance with the present invention; FIGS. 2 and 3 are cross sectional views through the tunnel window of FIG. 1 along sectional lines AA,

DETAILED DESCRIPTION OF THE PREFERRED EMBODIMENTS

FIGS. 3a-3d show an exemplary fabrication technique for forming an E$^2$PROM memory device cell in accordance with the present invention. As shown in FIG. 3a, a memory cell is formed on a substrate 30. Using known fabrication techniques similar to those used for conventional memory cells as described above, a variable thickness field oxide layer 32 is grown on the substrate 30. The variable thickness field oxide layer includes a first portion 34 having a first thickness and a second portion 36 having a second thickness. For example, the first portion 34 has a thickness of approximately 8500 Å and the second portion has a thickness considerably less than 8500 Å (e.g., several hundred Å).

In a preferred embodiment, a first implant region is defined on the substrate beneath the relatively thin second portion of the field oxide layer. The step of defining a first implant region includes a step of depositing a protective silicon nitride layer 38 on the variable thickness field oxide layer 32 where a tunnel window oxide layer is subsequently to be formed. The silicon nitride layer 38 is thus formed over a portion of the variable thickness field oxide layer 32 which will be used to form a tunnel area of the memory device cell shown. A photoresist material 40 is coated on the silicon nitride layer and the silicon nitride layer is etched to define edges 42. The photoresist material 40 and the etched silicon nitride layer 38 thus define boundaries of a first window having first and second openings 37 and 39 located on opposite sides of the silicon nitride layer 38 over the variable thickness field oxide layer 32.

Upon defining the aforementioned windows over the variable thickness field oxide layer 32, a first dose of a conductive material is implanted within a first implant region of the substrate 30 located beneath the first and second openings 37 and 39. In an exemplary embodiment, the conductive material used for this first implant is arsenic. The arsenic is implanted into a first region represented by the dotted lines 44 and 46 in FIG. 3b.

Subsequently, a second field oxide layer is grown on the first oxide layer as shown in FIG. 3b. This second oxide layer is grown along the entire length of the variable thickness field oxide layer 32 with the exception of the area beneath the silicon nitride layer 38 (note that some oxide will grow near edges of the silicon nitride layer thus deforming the silicon nitride layer). The second oxide layer is grown over the variable thickness field oxide layer until the variable thickness field oxide layer adjacent the silicon nitride layer is approximately 3000 Å thick.

A second implant region of the substrate 30 is then defined. As shown in FIG. 3c, the silicon nitride layer which has been deformed in FIG. 3b due to growth of the second oxide layer is chemically etched from the surface of the variable thickness field oxide layer 32. This chemical etching of the silicon nitride layer is preferably performed using hot phosphoric acid. A second photoresist mask 48 is then coated on the variable thickness field oxide layer 32 to establish a window 50 which defines a second implant region. Because the variable thickness field oxide layer 32 has been grown to a thickness (e.g., 3000 Å) considerably greater than the thickness of the first oxide layer remaining beneath the etched silicon nitride layer, the width of the window 50 defined by the second photoresist mask 42 need not be precise. Rather, the width of the tunnel window region is defined by the silicon nitride dimension (i.e., layer 38).

Once the window 50 has been defined, a second dose of a conductive material is implanted within the second implant region of the substrate located within the tunnel area 52 of FIG. 3c. In an exemplary embodiment, the conductive material used for the second dose is phosphorous. Following the phosphorous implant, a second implant region 54 as shown in FIG. 3d is thus established between the first implant regions 44 and 46. After thermal diffusion during subsequent processing, the second implant region 54 overlaps slightly with the first implant regions 44 and 46 to define a continuous tunneling gate as shown in FIG. 3d.

Returning to FIG. 3c, upon completion of the phosphorous implant, the first layer of oxide which had been previously protected by the silicon nitride layer 38 is etched from the substrate 30. In a preferred embodiment, the etching of the first oxide layer previously located beneath the silicon nitride layer 38 is etched using a chemical process. Etching of the first oxide layer is performed until the substrate in the tunnel area 52 is exposed as shown in FIG. 3c.

Because the first and second oxide layers form a variable thickness field oxide layer immediately adjacent the tunnel area 52 which is relatively thick (e.g., 3000 Å), the etching of the first oxide layer from the region of the substrate previously protected by the silicon nitride layer need not be precise. Rather, over-etching of the tunnel area will merely reduce the thickness of the variable thickness field oxide layer 32 located within the window 50 and will not increase the size of the tunnel window. Since only a thin oxide is etched (i.e., a few hundred Å instead of 3000 Å) even a plasma etch can be used and will cause less damage to the substrate, thereby reducing the propensity for leakage in the tunnel oxide. It is for this reason that the second photoresist mask 48 need not be defined with great accuracy, thus simplifying the fabrication process.

Once the substrate has been exposed in the tunnel area 52, a tunnel window oxide layer 56 having an accurate thickness can be grown over the tunnel area 52. In a preferred embodiment, the tunnel window oxide layer 56 is grown to approximately 100 Å. Afterwards, a first polysilicon layer 58 is deposited over the variable thickness field oxide layer 32 and the tunnel window oxide layer 56 as shown in FIG. 3d. The remaining stages of an E$^2$PROM memory device cell as shown in FIG. 1 are then performed in conventional fashion to form, for example, the floating gate 2 and the coupling gate 8.

By the aforementioned preferred fabrication process, a tunneling gate represented generally by the first and second implant regions 44, 46 and 54 in FIG. 3d can be formed from two different materials using two different doses. Accordingly, the first implant region 44, 46 can be formed with a relatively high dose to decrease the resistance in an area closest to a select transistor. However, the dose of the material used to form the second implant region 54 can be relatively low so that current leakage from the floating gate through the tunnel window oxide 56 is mitigated. Thus, an E$^2$PROM memory device cell can be formed with improved properties which provide high quality programming and erasure control over a relatively large number of programming cycles.

In a preferred embodiment as described above, although two separate implants independent of one another are used, only two masking steps are used as was the case with the FIG. 2a-d process. This is because the masking step used to form an active region of a select transistor (such as select transistor 12 in FIG. 1) is used to define the first window during formation of the first implant region as described above with respect to FIG. 3a.

Further, although two implant regions are used to define the tunneling gate, a preferred fabrication technique as described above is actually simplified. More particularly, the photoresist mask described above with respect to the conventional fabrication technique in FIG. 2c requires a relatively accurately placed window having very accurate dimensions. On the contrary, in accordance with the present invention, the photoresist mask used to define the window 50 can be formed with dimensions having a great deal of tolerance. The actual tolerance associated with these dimensions is limited only by the length of the variable field oxide layer on either side of the tunnel area 52.

Because the photoresist layer used to establish a mask for forming the implant region of the tunneling gate need not be accurately aligned with the field oxide layer, a relatively large window can be used to improve etching control during formation of the tunnel area. For example, the relatively wide window 50 facilitates wetting of the oxide layer previously protected by the silicon nitride layer 38 without concern that over-etching will remove the oxide from areas over the substrate adjacent the tunnel area.

Accordingly, the precision previously required for fabricating a conventional E$^2$PROM memory cell is not required in accordance with a preferred fabrication technique of the present invention. However, a resulting memory cell designed in accordance with the present invention has improved tunneling characteristics which could not previously be realized. These characteristics included improved programming and erasing operations, and extended life of the memory cell.

Using fabrication techniques as described above, a semiconductor memory device cell designed in accordance with the invention is formed which is similar to that described above with respect to FIG. 1. However, there are two key differences. First, the tunnel window is easily defined by wet etching an oxide of a few hundred Å thickness instead of an uncontrollable wet etch or a substrate damaging plasma etch of a thicker, decoupling oxide. A tunneling oxide grown therefore has a well defined size and less leakage and hence provides a longer life for the memory cell. Second, the tunneling gate 4 is no longer formed with a single n-material, but rather is formed with two different doses of the same or different implant materials as described above with respect to FIG. 3d. A tunneling gate formed with first and second implant regions provides improved operating characteristics and extends the life of the memory device cell.

It will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. Method for fabricating a cell for use in a semiconductor memory device comprising the steps of:
   forming a first oxide layer of varying thickness on a semiconductor substrate, said oxide layer having a first portion formed of a first thickness and a second portion formed of a second thickness greater than said first thickness;
   defining a first implant region of said substrate beneath said first portion of said oxide layer, said step of defining further including depositing a nitride layer in a tunnel area of said first portion, coating a photoresist material as a mask on said nitride layer, and etching said nitride layer to define edges of said nitride layer;
   implanting a first dose of a conductive material within said first implant region;
   removing said photoresist mask;
   growing a second oxide layer on said first oxide layer with said nitride layer in place over said tunnel area of said first oxide layer;
   defining a second implant region of said substrate beneath said tunnel area of said first oxide layer, said step of defining a second implant region further including steps of removing said nitride layer, and coating a second photoresist mask on said second oxide layer;
   implanting a second dose of a conductive material within said second implant region;
   removing said first layer of oxide from said tunnel area and removing said second photoresist mask;
   growing a tunnel window oxide layer on said substrate; and
   depositing at least a first polysilicon layer over said tunnel window oxide layer to form a conductive region of said semiconductor memory cell.

2. Method according to claim 1, wherein different materials are used for said first and second implants.

3. Method according to claim 2, wherein arsenic is used for said first implant and phosphorous is used for said second implant.

4. Method according to claim 1, wherein an amount of said first dose is different from an amount of said second dose, said first dose being higher than said second dose.

5. Method according to claim 1, wherein said step of removing said nitride layer further includes the step of:

chemically etching said nitride layer with hot phosphoric acid.

6. Method according to claim 1, wherein said step of removing said first layer of oxide from said tunnel area further includes the step of:

chemically etching said first and second oxide layers until the substrate is exposed within said tunnel area.

7. Method according to claim 1, wherein step of growing said tunnel window oxide layer is performed until said tunnel window oxide layer is approximately 100 Angstroms thick.

8. Method according to claim 7, wherein an oxide layer adjacent said tunnel window oxide layer is approximately 300 Angstroms thick.

9. Method according to claim 1, wherein said first and second implant regions overlap to form a tunneling gate of the memory cell.

10. Method for fabricating a cell for use in a semiconductor memory device comprising the steps of:

forming a first oxide layer on a semiconductor substrate;

defining a first implant region of a tunneling gate in said substrate beneath said first oxide layer;

implanting a first dose of a conductive material within said first implant region;

defining a second implant region of said tunneling gate adjacent said first implant region in said substrate beneath a tunnel area of said first oxide layer;

implanting a second dose of a conductive material within said second implant region;

removing said first layer of oxide from said tunnel area; and growing a tunnel window oxide layer on said substrate.

11. Method according to claim 10, wherein said first implant material is arsenic and said second implant material is phosphorous.

12. Method according to claim 10, wherein said step of defining a first implant region is also used to define an active region of peripheral transistors on the substrate.

13. Method according to claim 10, wherein said step of defining a first implant region further includes a step of:

depositing a silicon nitride layer in said tunnel area of said first oxide layer, said second implant region corresponding to an area of said substrate beneath said silicon nitride layer.

14. Method according to claim 13, wherein edges of said silicon nitride layer define an interface between said first implant region and said second implant region in said substrate.

* * * * *